United States Patent [19]
Petridis et al.

[11] Patent Number: 4,661,201
[45] Date of Patent: Apr. 28, 1987

[54] PREFERENTIAL ETCHING OF A PIEZOELECTRIC MATERIAL

[75] Inventors: Petros Petridis; Darrel E. Newell; Keneth D. Hartman, all of DeKalb, Ill.

[73] Assignee: CTS Corporation, Elkhart, Ind.

[21] Appl. No.: 773,923

[22] Filed: Sep. 9, 1985

[51] Int. Cl.⁴ ........................ B44C 1/22; C03C 15/00; C03C 25/06
[52] U.S. Cl. .................................. 156/628; 156/643; 156/647; 156/649; 156/654; 156/663; 219/121 LJ; 219/121 LM
[58] Field of Search ................ 156/628, 643, 647–649, 156/654, 663; 252/79.3; 219/121 LJ, 121 LM

[56] References Cited
U.S. PATENT DOCUMENTS

| | | | |
|---|---|---|---|
| 3,626,141 | 12/1971 | Daly | 219/121 L |
| 3,814,895 | 6/1974 | Fredriksen | 219/121 L |
| 3,816,700 | 6/1974 | Weiner et al. | 219/121 L |
| 3,991,296 | 11/1979 | Kojima et al. | 219/121 L |
| 4,046,985 | 9/1977 | Gates | 219/121 L |
| 4,141,456 | 2/1979 | Hart | 214/1 R |
| 4,182,024 | 1/1980 | Cometta | 29/571 |
| 4,450,041 | 5/1984 | Akufi | 156/628 |

OTHER PUBLICATIONS

Laser-Induced Twinning in Quartz, by T. L. Anderson et al., Materials Research Laboratory, Pennsylvania State University, 1976.

*Primary Examiner*—William A. Powell
*Attorney, Agent, or Firm*—Rodger H. Flagg

[57] ABSTRACT

A method for preferentially etching a piezoelectric material is disclosed wherein a portion of the piezoelectric material is controllably subjected to a concentrated thermal energy source with a force sufficient to alter the crystalline orientation of the piezoelectric material. The piezoelectric material is then treated with a suitable echant for a controlled duration, wherein the portion of the piezoelectric material altered by the concentrated thermal energy source is etched at a different etching rate than the unaltered piezoelectric material, to preferentially etch a controlled anaglyphic planar configuration upon the piezoelectric material.

20 Claims, 13 Drawing Figures

PRESENT INVENTION

RIGHT-HAND

LEFT-HAND

PREFERENTIAL ETCHING OF A PIEZOELECTRIC MATERIAL

TECHNICAL FIELD

This invention relates to etching a piezoelectric material, such as quartz. More specifically, this invention relates to preferential etching to achieve an anaglyphic planar configuration upon at least one surface of the piezoelectric material, which is useful in making miniature resonators, tuning crystals, high frequency quartz plates, and the like.

BACKGROUND ART

Two methods are typically used to modify the planar configuration of a piezoelectric material. One method is photolithographic processing. This method employs multiple processing steps, such as cleaning; metalization of a protective mask; photoresist application; developing and etching the protective mask; etching the piezoelectric material; and removal of the protective mask. This method is time consuming and greatly increases the cost of the etched piezoelectric material.

Another method is ion etching. This method requires aligning and securing the piezoelectric material to an inclined target plate, positioning and securing an aperatured protective mask over the piezoelectric material, and passing an ion beam from an ion source through the aperatures in the protective mask to etch the piezoelectric material along the aperatured configuration. This method is very slow, which greatly increases the cost of the etched piezoelectric material.

Various apparatus has been used for laser "scribing" or "dicing" a wafer or substrate. Reference U.S. Pat. Nos. 3,816,700; 3,991,296; 3,626,141 and 3,814,895. Diamond cutting tools, abrasive wheels, circular saws and lasers are typically used to physically remove a semiconductor material, such as silicone, or a dielectric material, such as alumina. Partial removal of material is often called "scribing," whereas cutting through such material is often called "dicing." Lasers have not typically been used to "scribe" or "dice" piezoelectric material, due to the anisotropic nature of the material. Twinning is induced in most piezoelectric materials by mechanical or thermal stress. This "twinning" acts to raise the inductance and effective resistance of the piezoelectric material as well as raising or lowering the frequency of the crystal, depending upon the type of piezoelectric material used. Reference is made to *Laser Induced Twinning in Quartz* by T. L. Anderson et al., published by Materials Research Laboratory, Pennsylvania State University, 1976.

Also known are various methods for aligning wafers or substrates, such as taught by U.S. Pat. Nos. 4,141,456; 4,182,024 and 4,046,985. These patents disclose mounting a wafer or substrate on an X-Y axis table, and controllably moving the X-Y axis table by means of a computerized control unit.

DISCLOSURE OF THE INVENTION

This invention relates to a method for preferentially etching a piezoelectric material by controllably passing a concentrated thermal energy source, such as a laser, electromagnetic beam, a particle beam, an ion beam, or ultrasonic energy source over a portion of the piezoelectric material. The concentrated thermal energy source is preferably controlled by one or more of following means: power, time, frequency and cross-sectional area. To be effective, the concentrated thermal energy source is of a force sufficient to effect a change in the crystalline orientation of the piezoelectric material, in direct proximity to contact with the concentrated thermal energy source.

The piezoelectric material is then preferentially etched with an suitable echant, such as ammonium biofluoride or hydrofluoric acid, which acts to etch the portion treated by the concentrated thermal energy source at one etching rate, and the untreated portion of the piezoelectric material at a different etching rate. Thus, by controlling the duration of contact of the echant to the piezoelectric material, an anaglyphic planar configuration is achieved, without intensive labor or high cost associated with photolithographic processing or conventional ion etching.

BEST MODE FOR CARRYING OUT THE INVENTION

Figure 1A:
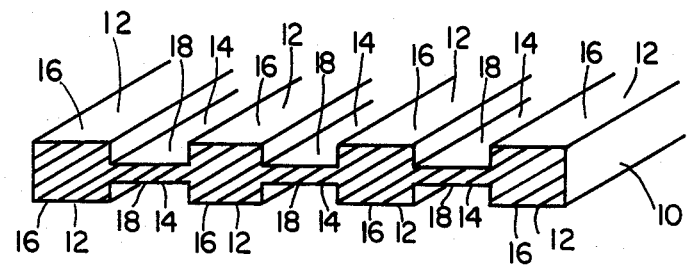
FIG. 1A is an enlarged cutaway view of the anaglyphic planar configuration of the piezoelectric material having the raised portion altered by the concentrated thermal energy source.

The subject matter which we regard as our invention is particularly pointed out and distinctly claimed in the claims. The structure and operation of our invention, together with further objects and advantages, may be better understood from the following description given in connection with the accompanying drawings, in which:

FIG. 1A shows a cutaway view of an etched homogeneous piezoelectric material 10 having an anaglyphic planar configuration wherein the plurality of raised portions 12 were subjected to a concentrated energy source to alter the crystalline orientation 16, which resulted in the preferential etching of the piezoelectric material 10, having raised portions 12 where the concentrated thermal energy source was applied, and recessed portions 14 where the concentrated thermal energy source was not applied.

The anaglyphic planar configuration shown was the result of preferential etching caused by the different etching rates of the altered portions 16 and the unaltered portions 18 of the piezoelectric material 10.

Figure 1B:
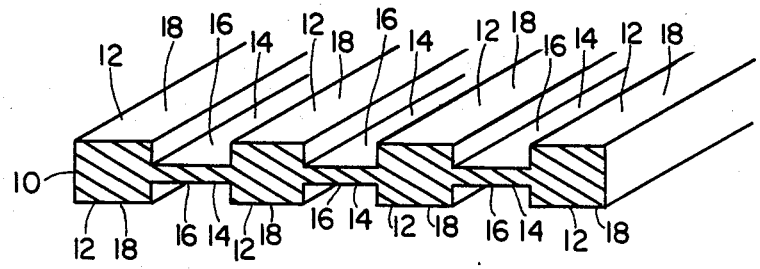
FIG. 1B is an enlarged cutaway view of the anaglyphic planar configuration of the piezoelectric material having the recessed portion altered by the concentrated thermal energy source.

In. FIG. 1B, a different orientation of the piezoelectric material 10 results in the portion of the piezoelectric material altered 16 by the concentrated thermal energy source to be recessed 14, whereas the unaltered 18 portion of the piezoelectric material 10 is raised 12.

Figure 2A:
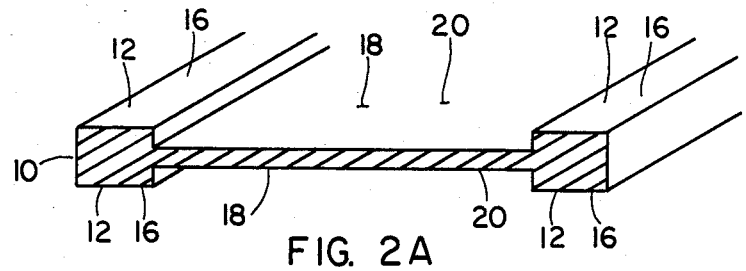
FIG. 2A is an enlarged cutaway view of an opposing inverted mesa configuration etched upon the piezoelectric material.

As shown in FIG. 2A, the portion of the piezoelectric material altered 16 by the concentrated energy source is raised 12 to form an opposed, anaglyphic planar configuration, such as an inverted mesa 20 useful for fine tuning resinators, the fabrication of high frequency quartz plates, and the like. The preferential etching results from the different etching rates of the altered 16 and unaltered 18 portions of the piezoelectric material 10, as previously disclosed, to obtain non-homogeneous results.

Figure 2B:
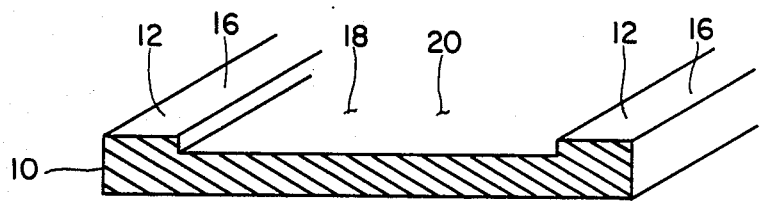
FIG. 2B is an enlarged cutaway view of an inverted mesa contoured configuration on one side of the piezoelectric material.

FIG. 2B discloses an alternate configuration, wherein the inverted mesa 20 is disposed upon only one side of the piezoelectric material 10.

The orientation of the piezoelectric material 10 is affected by the anistropic nature of the material, such as electric conductivity or light transmission, which varies according to the direction in which they are measured.

Figure 3A:
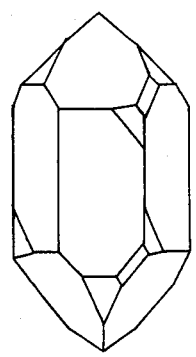
FIG. 3A is a plan view of a crystal exhibiting a right hand configuration.
Figure 3B:
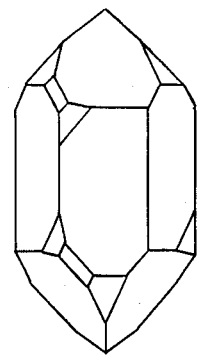
FIG. 3B is a plan view of a crystal exhibiting a left hand configuration.

Referring now to FIGS. 3A and 3B, it is apparent that piezoelectric material, such as quartz crystals, often exhibit right hand and left hand orientation. This orientation affects the anistropic nature of the material used.

A crystal is said to be right handed if the plane of polarization is rotated clockwise as seen by an observer looking through the crystal towards a source of light. Opposite rotation denotes a left handed crystal. Both left hand and right hand orientation piezoelectric material may be used with this invention, but attention must be given to the hand in cutting certain types of piezoelectric material, prior to etching.

There are several modes of plastic deformation. "Slip" results in considerable displacement between a few widely separated slip planes. "Twinning" is another form of plastic deformmation. Twinning refers to a partial displacement on each of many neighboring crystallographic planes. Deformation by twinning results in a mirror image deformation of the twinned portion when compared to the untwinned portion of the piezoelectric material.

There are two types of twinning common to piezoelectric material 10, such as quartz. Electrical twinning effects only the electrical conductivity and the handedness of the piezoelectric material.

Electrical twinning occurs when the temperature of the pizeoelectric material is raised above the inversion point, 573° C. for quartz and the temperature subsequently lowered below the inversion point. Twinning may also be induced at a much lower temperature when a sharp temperature gradient is present in the piezoelectric material.

Figure 4:
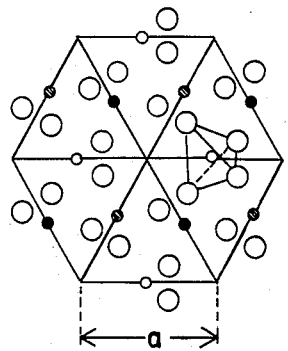
FIG. 4 is a diagram of a left-handed quartz structure.

FIG. 4 shows the structure of the left-handed quartz. The large open circles are oxygen atoms. The small open circles are silicon atoms in the plane of the section. The small filled circuits show silicon atoms lying 2C above the plane. The cross-hatched small circles show silicon atoms lying C below the plane. In FIG. 4, a=4.-90A.

Figure 5A:
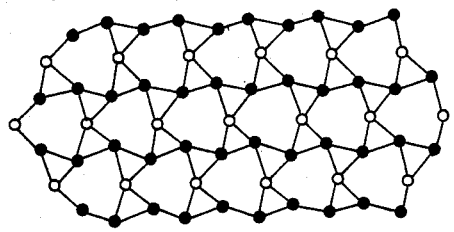
FIG. 5A is a diagram of a piezoelectric structure.
Figure 5B:
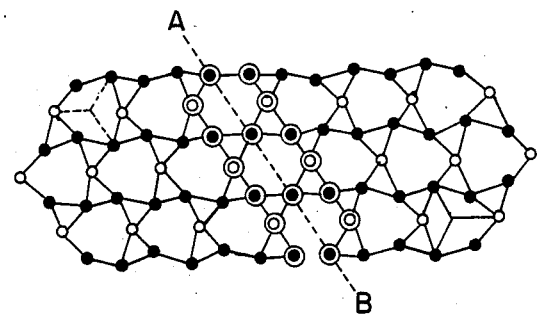
FIG. 5B is a diagram of a piezoelectric structure showing the twin axis at line A-B.

The high quartz shown in FIG. 4 may be transformed into low quartz, as shown in FIG. 5B, right hand side, or with equal ease as shown on the left hand side. FIGS. 5A and 5B show that the two orientations are symetrically related to each other by a 180° rotation, about line A-B in FIG. 5. Line A-B is thus the twin axis, which is referred to as dauphine twinning in quartz. Dauphine twins may be revealed by etching quartz with hydrofluoric acid or other fluoride compounds.

The altered state of a piezoelectric material may be induced by a concentration thermal energy source 22, such as a laser, an electromagnetic beam, a particle beam, an ion beam, or an ultrasonic beam having a force sufficient to alter the orientation of the pizeoelectric material in a manner similar to twinning.

The altered portion 18 of the piezoelectric material 10 reacts differently to a given echant than does an unaltered portion 20, resulting in different etching rates between the two. This difference in etching rates is used by the present invention, to provide a method for preferentially etching the piezoelectric material 10.

To be effective, the concentrated thermal energy source 22 and the piezoelectric material 10 are controllably positioned and moved in a desired pattern in relation to each other.

Figure 6A:
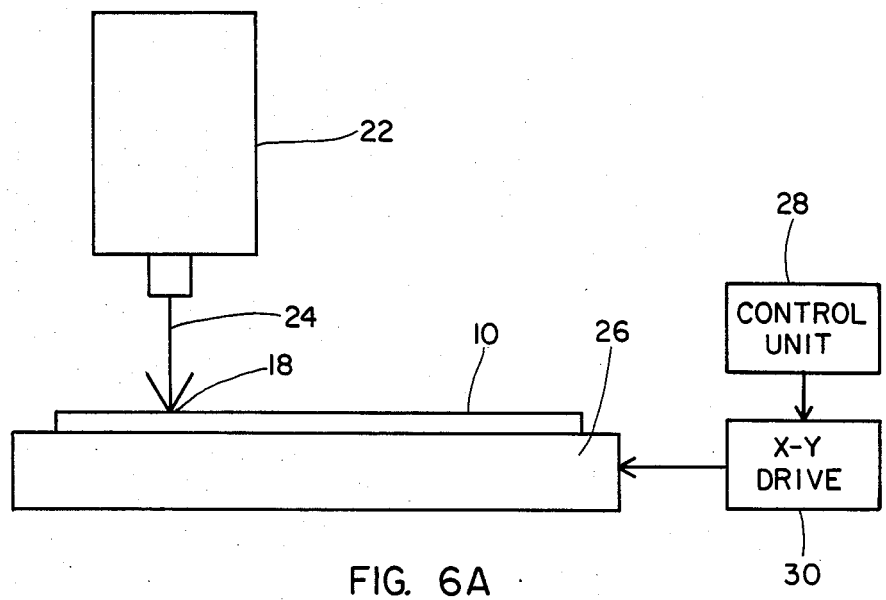
FIG. 6 is a diagram of the concentrated thermal energy source positioned above the piezoelectric material, and the piezoelectric material is positioned on an X-Y axis table for controllably positioning in material relative to the concentrated thermal energy source.
FIG. 6B is a diagram of the concentrated thermal energy source, wherein the piezoelectric material is secured to a stationary table, and the concentrated thermal energy source is controllably positioned relative to the piezoelectric material.

FIG. 6A shows the piezoelectric material 10 positioned upon an X-Y axis table 26, which is controllably moved by an X-Y drive 28 controlled by a computerized control unit 30, which provides a controlled movement in a desired pattern of table 26 in relation to the fixably positioned concentrated energy beam 24 supplied by the concentrated thermal energy source 22.

Figure 6B:
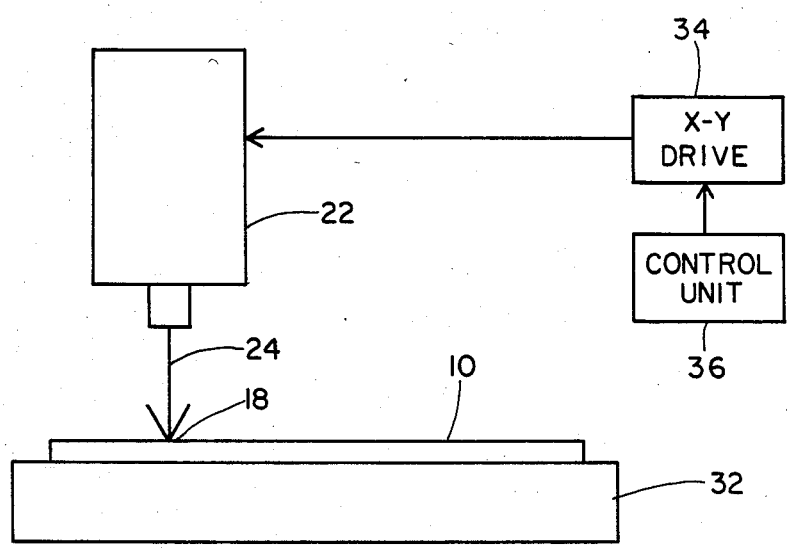

Conversely, the same results may be obtained by positioning the piezoelectric material 10 upon a fixed table 32, and controllably moving the energy beam 24 or concentrated thermal energy source 22 with a suitable X-Y drive 34 controlled by a computerized control unit 36, as shown in FIG. 6B.

For best results, at least one of the power, time, frequency and cross sectional area of the concentrated thermal energy source is controlled to obtain the desired results. The power output of the concentrated thermal energy source may vary according to the thickness of the piezoelectric material 10 and the depth of penetration desired. The time or duration of contact will depend upon the type of piezoelectric material used, and the type of energy source used. The frequency will depend upon the type and orientations of the piezoelectric material 10, as well as the size and shape of the material. The cross-sectional area of the concentrated thermal energy source will determine the size limitation of the altered and unaltered pattern upon the piezoelectric material 10.

Tests with a $Co_2$ laser powered at 0.5 to 3.0 watts on a quartz crystal material with a thickness of 0.0065 to 0.0164 inches, for one-quarter inch (¼) per second at a wave length of 10.5 micrometers (MM), consistently provided satisfactory results. Other lasers known to the art may be adapted to provide similar results. Any concentrated thermal energy source having a force sufficient to alter the anisotropic state of the piezoelectric material will achieve the desired results.

Once the anisotropic state of a portion of the piezoelectric material has been altered as disclosed herein, the piezoelectric material is ready for preferential etching.

Preferably, the pizeoelectric material is cleaned prior to etching to remove any foreign contamination present. An echant is then selected for compatibility with a paricular orientation of piezoelectric material.

Table I shows several types of crystal orientation useful for cutting a piezoelectric material.

TABLE I

| Type Cut | Mode | thi($\phi$) | theta ($\theta$) |
|---|---|---|---|
| AT | Xy | −35° 15' | 54° 45' |
| SC | C | 21° 90' | 34° 10' |
| DT | $Z^1$x | 54° 40' | −38° 15' |

An At-cut selectively altered piezoelectric wafer was etched in an ammonium biofluoride ($NH_4.HF$) to provide preferential etching between altered and unaltered portions of the piezeoelectric material. With AT-cut piezoelectric wafers, the altered portion has a slower etching rate. (See FIG. 1A).

When an SC-cut wafer was etched with ammonium biofluoride ($NH_4.HF$), only one side of the wafer was etched and the altered portion had a slower etching rate. (See FIG. 2B).

When the SC-cut wafer was etched in hydrofluoric acid (HF) at a 40% concentration, both sides of the wafer were etched and on one side, the altered portion had a slower etching rate, and on the opposite side, the altered portion had a faster etching rate. A DT-cut piezoelectric wafer etched with aluminum biofluoride ($NH_4.HF$) caused the area altered by a concentrated thermal energy source to be raised on one side.

From these examples, it can be determined that the etching rate is determined upon the anisotropic orientation of the piezeoelectric material. The anisotropic orientation of the piezoelectric material may be selectively altered by a concentrated energy beam of a suitable force. The thermal energy delivered to the piezoelectric material by the concentrated energy source is responsible for altering the anisotropic orientation of the piezoelectric material.

Figure 7:
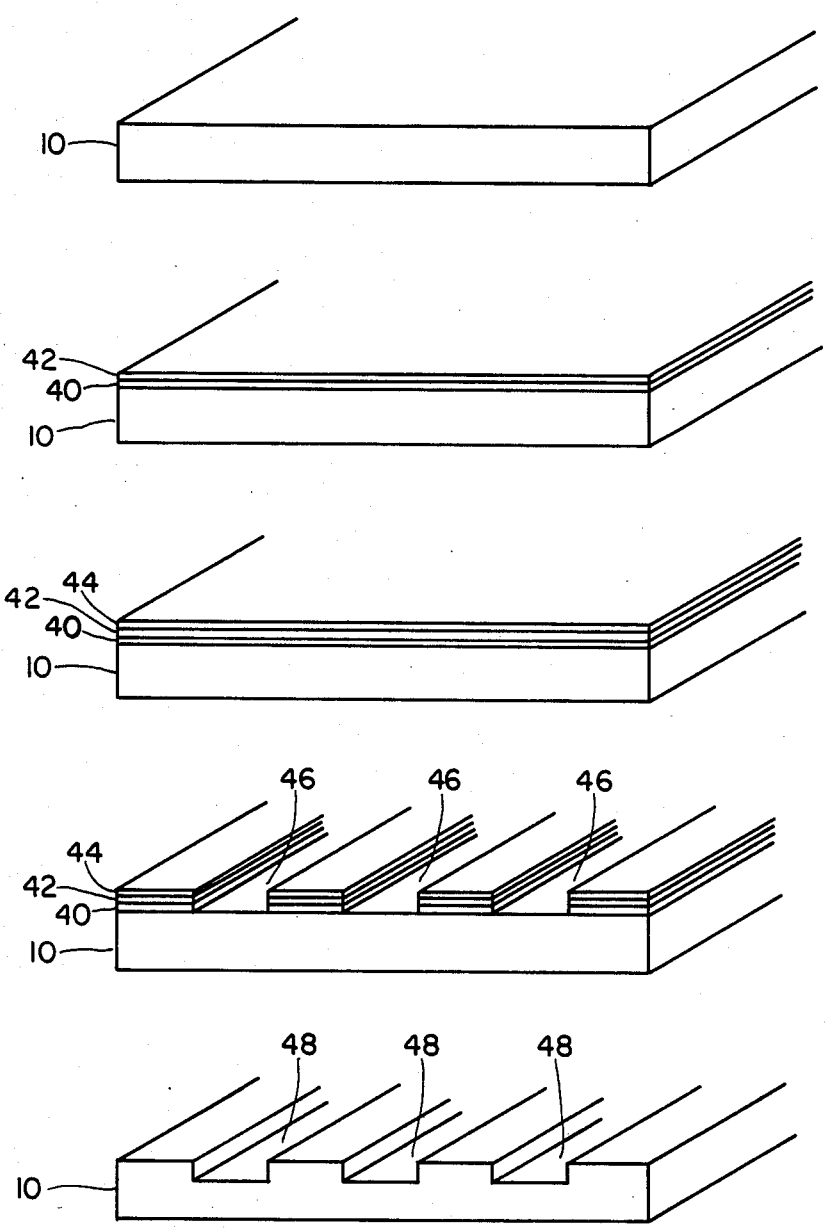
FIG. 7 is a sequential view of the processing steps of photolithographic processing as practiced in the prior art.

The prior art steps for photolithographic processing are outlined in FIG. 7 in contrast to the preferential etching of a piezoelectric material disclosed herein.

Step 1 includes the application of an adhesion layer 40 adjacent to piezoelectric material 10. A metalization layer 42 is placed adjacent to the adhesion layer 40.

Step 3 includes the application of a photoresist emulsion 44 in a desired pattern over the metalization layer 42. Step 4 includes development of a photoresist emulsion 44, and metal mask etching to remove the photoresist emulsion 44, metalization layer 42 and adhesion layer 40 in area 46 in preparation for piezoelectric etching. Step 5 includes etching of the piezoelectric material 10 in area 46. Step 6 includes removal of photoresist emulsion 44, metalization layer 42, and adhesion layer 40 in the non-etched areas. Step 7 includes the piezoelectric material 10 with areas 48 eched therein.

Figure 8:
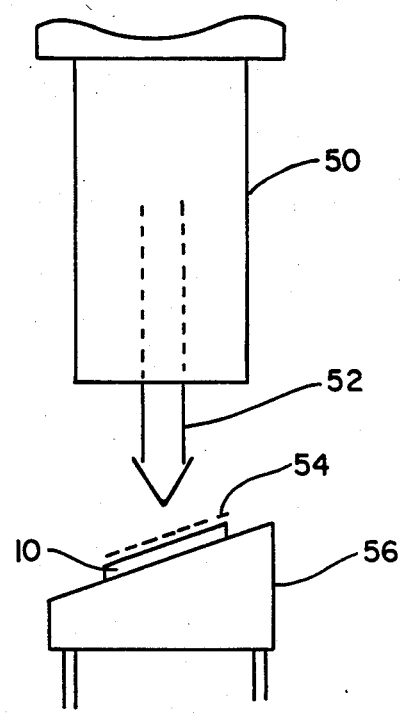
FIG. 8 is a diagram of the apparatus used for ion etching as practiced in the prior art.

Referring now to FIG. 8, the prior art apparatus used for ion etching is disclosed. An ion source 50 generates an ion beam 52 towards an inclined piezoelectric material 10. Located between the ion beam 52 and the piezoelectric material 10 is a protective mask 54, with aperatures 55 disposed in a desired pattern therethrough. The ion beam passing through aperatures 55 removes a portion of the piezoelectric material to form the desired configuration.

Therefore, by altering the anisotropic orientation of a portion of a piezoelectric material in a desired pattern, and by selecting a suitable echant for preferential etching, a desired anaglyphic panar configuration may be economically achieved, as disclosed herein, with consistent results.

While this invention has been described with reference to a particular embodiment, it is to be understood that modifications may be made without departing from the spirit of the invention, or from the scope of the following claims.

INDUSTRIAL APPLICABILITY

Preferential etching of a piezoelectric material to achieve a desired anaglyphic planar configuration in accordance with the anisotropic nature of the piezoelectric material used, for use with crystal technology in electrical and acoustical equipment.

We claim:

1. A method for preferentially etching a homogeneous piezoelectric material at different etching rates, which comprises:
    (a) controllably subjecting a portion of the piezoelectric material to a concentrated thermal energy source; said energy source of a force sufficient to alter the crystalline orientation of the piezoelectric material subjected to the concentrated energy source;
    (b) treating the piezoid material with a selected enchant for a controlled duration; wherein the portion of the piezoelectric material not altered by the concentrated energy source is etched at a different rate than the etching rate of the portion of the piezoelectric material altered by the concentrated thermal energy source to preferentially etch a controlled anaglyphic planar configuration upon the piezoelectric material.

2. The method of claim 1, wherein the piezoelectric material is a quartz crystal.

3. The method of claim 1, wherein the concentrated thermal energy source is controlled by at least one of the power, time, frequency and cross-sectional area of the concentrated energy source.

4. The method of claim 1, wherein the concentrated thermal energy source is a laser beam.

5. The method of claim 1, wherein the concentrated thermal energy source is an electromagnetic beam.

6. The method of claim 1, wheren the echant is ammonium biofluoride.

7. The method of claim 1, wherein at least one of the piezoelectric material and the concentrated thermal energy source is movably positioned in relation to the other.

8. A method of treating a homogeneous piezoelectric material to introduce nonhomogeneous properties, which comprise:
    (a) controllably subjecting a portion of the piezoelectric material to a concentrated thermal energy source, said energy source of a force sufficient to alter the anisotropic character of the piezoelectric material along at least one axis of orientation; and
    (b) treating the piezoelectric material with an echant, in which the echant attacks the altered portion of the piezoelectric material at a rate different from the unaltered portion of the piezoelectric material not subjected to the concentrated thermal energy source; and (c) controlling the duration of contact of the echant to produce a homogeneous piezoelectric material exhibiting non-homogeneous properties.

9. The method of claim 8, wherein the piezoelectric material is a quartz crystal.

10. The method of claim 8, wherein the concentrated thermal energy source is controlled by at least one of a power, time, frequency and cross-sectional area of the concentrated energy source.

11. The method of claim 8, wherein the concentrated thermal energy source is a laser beam.

12. The method of claim 8, wherein the concentrated thermal energy source is an electromagnetic beam.

13. The method of claim 8, wherein the echant is ammonium biofluoride.

14. A method for preferentially etching a piezoelectric material, which comprises:

(a) actuating a concentrated thermal energy source in proximity to a portion of the piezoelectric material at a force sufficient to alter the crystal orientation of that portion of the piezoelectric material; and (b) preferentially etching the piezoelectric material by subjecting the piezoelectric material to an echant, wherein the altered portion of the piezoelectric material is etched at a rate different from the etching rate of the unaltered piezoelectric material to effect a preferential anaglyphic planar configuration therebetween.

15. The method of claim 14, wherein at least one of the piezoelectric material and the concentrated thermal energy source is movably positioned in relation to the other.

16. The method of claim 14, wherein the concentrated thermal energy source is controlled by at least one of a power, time, frequency and cross-sectional area of the concentrated energy source.

17. The method of claim 14, wherein the concentrated thermal energy source is a laser beam.

18. The method of claim 14, wherein the concentrated thermal energy source is an electromagnetic beam.

19. The method of claim 14, wherein the echant is ammonium biofluoride.

20. The method of claim 14, wherein the piezoelectric material is in contact with the echant for a controlled duration.

* * * * *